(12) United States Patent
Guntoro et al.

(10) Patent No.: US 11,955,197 B2
(45) Date of Patent: Apr. 9, 2024

(54) MEMORY DEVICE AND METHOD FOR SHIFTING MEMORY VALUES

(71) Applicant: Robert Bosch GmbH, Stuttgart (DE)

(72) Inventors: Andre Guntoro, Weil der Stadt (DE); Chirag Sudarshan, Kaiserslautern (DE); Christian Weis, Kaiserslautern (DE); Leonardo Luiz Ecco, Stuttgart (DE); Taha Ibrahim Ibrahim Soliman, Renningen (DE); Norbert Wehn, Queidersbach (DE)

(73) Assignee: ROBERT BOSCH GMBH, Stuttgart (DE)

( * ) Notice: Subject to any disclaimer, the term of this patent is extended or adjusted under 35 U.S.C. 154(b) by 164 days.

(21) Appl. No.: 17/746,096

(22) Filed: May 17, 2022

(65) Prior Publication Data

US 2022/0383913 A1 Dec. 1, 2022

(30) Foreign Application Priority Data

May 26, 2021 (DE) ...................... 10 2021 205 327.0

(51) Int. Cl.
| | |
|---|---|
| *G11C 7/12* | (2006.01) |
| *G06F 3/06* | (2006.01) |
| *G11C 7/08* | (2006.01) |
| *G11C 7/10* | (2006.01) |
| *G11C 8/08* | (2006.01) |

(Continued)

(52) U.S. Cl.
CPC .............. *G11C 7/08* (2013.01); *G06F 3/0656* (2013.01); *G11C 7/1012* (2013.01); *G11C 7/1018* (2013.01); *G11C 7/1036* (2013.01); *G11C 7/12* (2013.01); *G11C 8/08* (2013.01);
(Continued)

(58) Field of Classification Search
CPC ... G06F 3/0656; G11C 7/1012; G11C 7/1018; G11C 7/1036; G11C 7/12; G11C 11/4094; G11C 11/4096; G11C 7/1006
See application file for complete search history.

(56) References Cited

U.S. PATENT DOCUMENTS 5,477,477 A * 12/1995 Saitou ..................... G06F 5/015
708/209
6,307,794 B1 * 10/2001 Haga .................... G11C 29/848
365/240

(Continued)

FOREIGN PATENT DOCUMENTS

DE 102016116095 A1 3/2018

*Primary Examiner* — Mushfique Siddique
(74) *Attorney, Agent, or Firm* — NORTON ROSE FULBRIGHT US LLP; Gerard A. Messina

(57) ABSTRACT

A memory device comprising a cell field having memory cells, N bit lines, which are respectively connected to at least one of the memory cells of the cell field, N being a whole number greater than one, N sense amplifiers; a bit shift circuit, which has S switch element rows, S being a whole number greater than one and a row number in the range from zero to S-1 being assignable to each switch element row. Each switch element row includes at least one semiconductor switch element connected to one of the bit lines and one of the sense amplifiers. Switch elements of each row connect all bit lines, whose bit line number is smaller than or equal to N minus the row number, to sense amplifiers, so that the respective sense amplifier number is equal to the respective bit line number plus the row number.

12 Claims, 6 Drawing Sheets

(51) Int. Cl.
*G11C 11/4091* (2006.01)
*G11C 11/4094* (2006.01)
*G11C 11/4096* (2006.01)

(52) U.S. Cl.
CPC ...... *G11C 11/4091* (2013.01); *G11C 11/4094* (2013.01); *G11C 11/4096* (2013.01); *G11C 7/1006* (2013.01)

(56) References Cited

U.S. PATENT DOCUMENTS

| | | | | |
|---|---|---|---|---|
| 6,816,420 | B1* | 11/2004 | Liu | G11C 29/86 365/189.12 |
| 6,876,596 | B1* | 4/2005 | Kirihara | G11C 16/08 365/230.06 |
| 2001/0002176 | A1* | 5/2001 | Ooishi | G11C 29/848 365/189.02 |
| 2001/0028584 | A1* | 10/2001 | Nakayama | G11C 29/24 365/203 |
| 2006/0018142 | A1* | 1/2006 | Srinivasan | G11C 15/00 365/49.16 |
| 2009/0323427 | A1 | 12/2009 | Mukunoki | |
| 2012/0113731 | A1 | 5/2012 | Shimano et al. | |
| 2022/0383937 | A1* | 12/2022 | Guntoro | G11C 11/4091 |

* cited by examiner

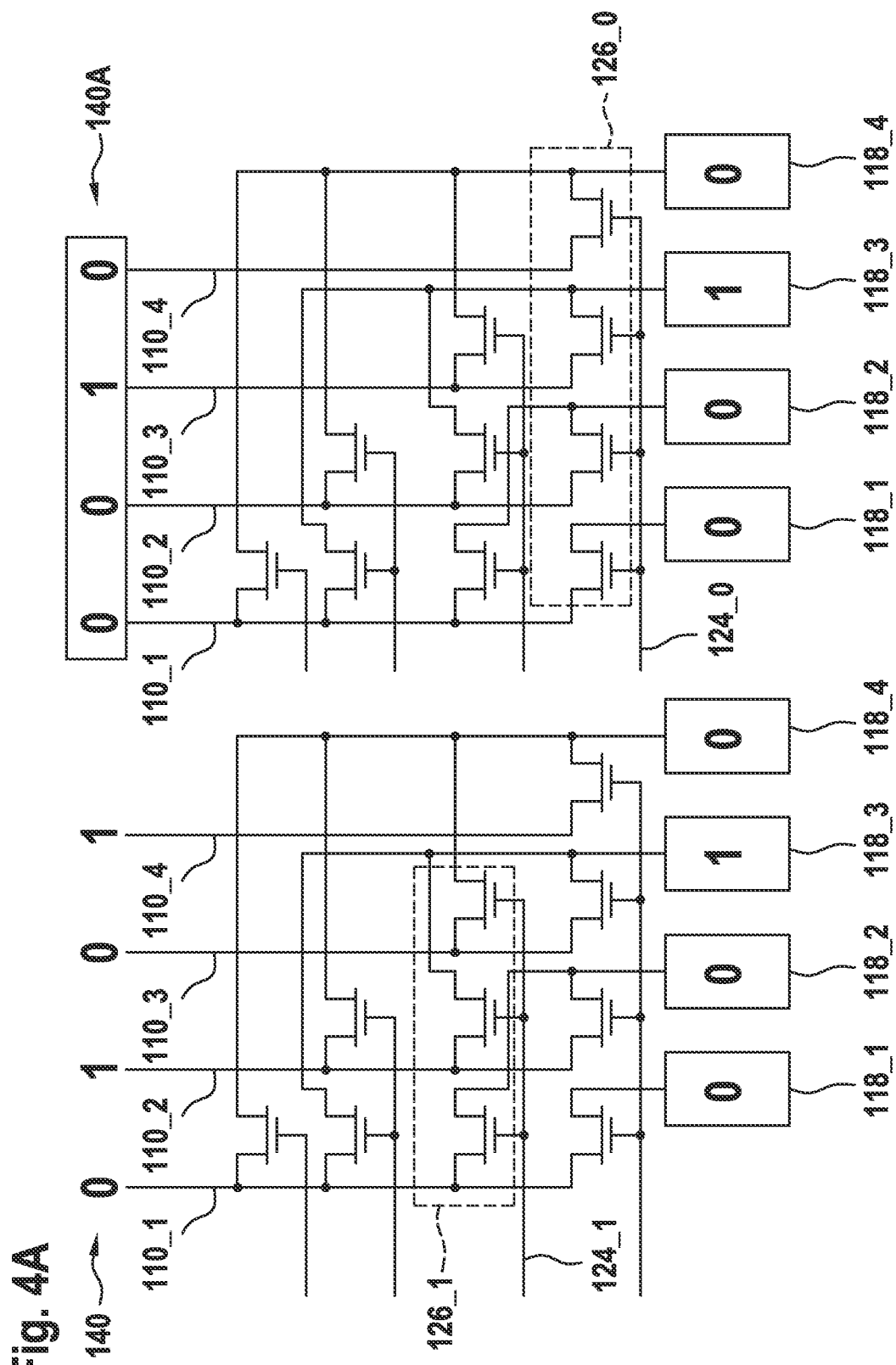

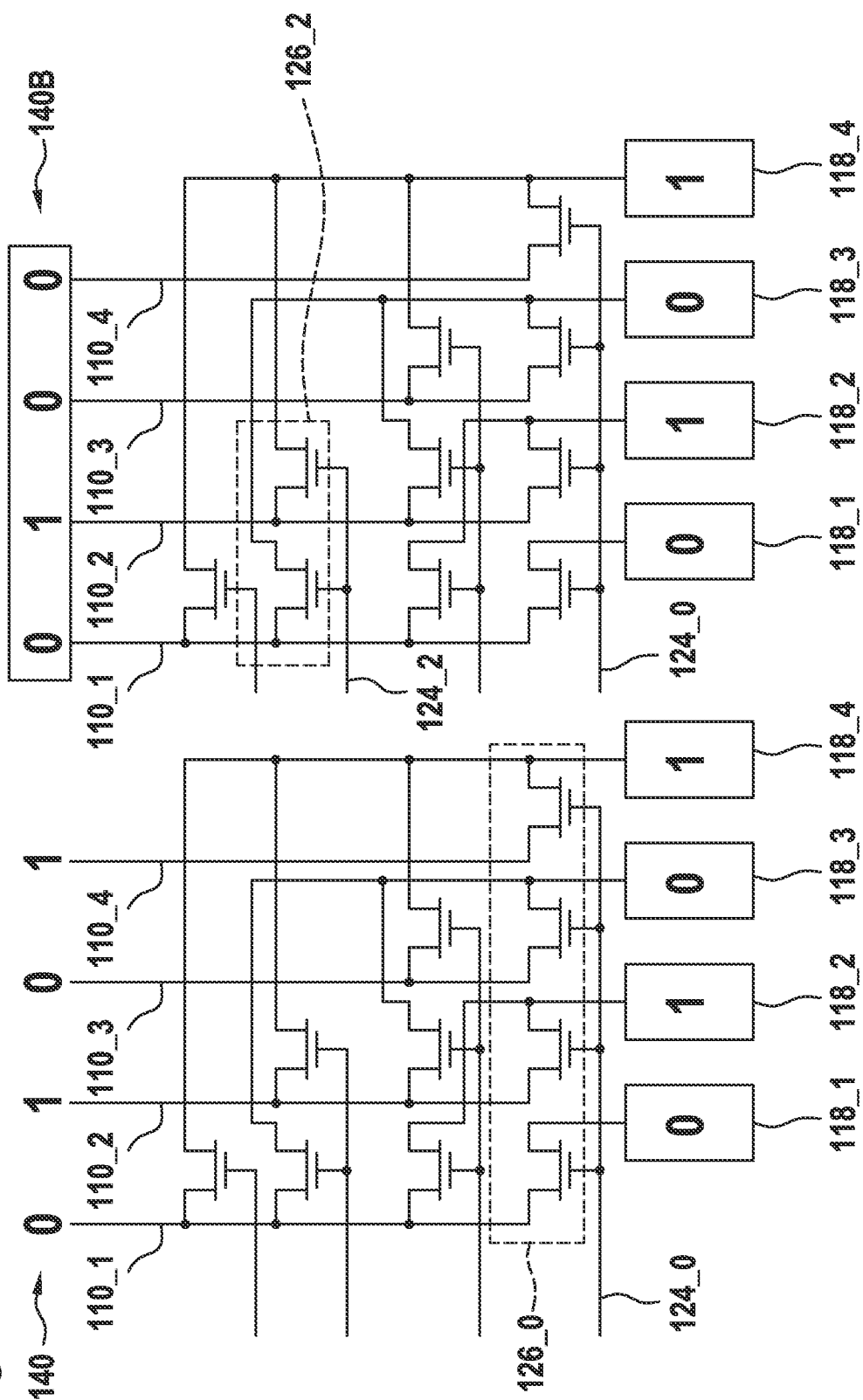

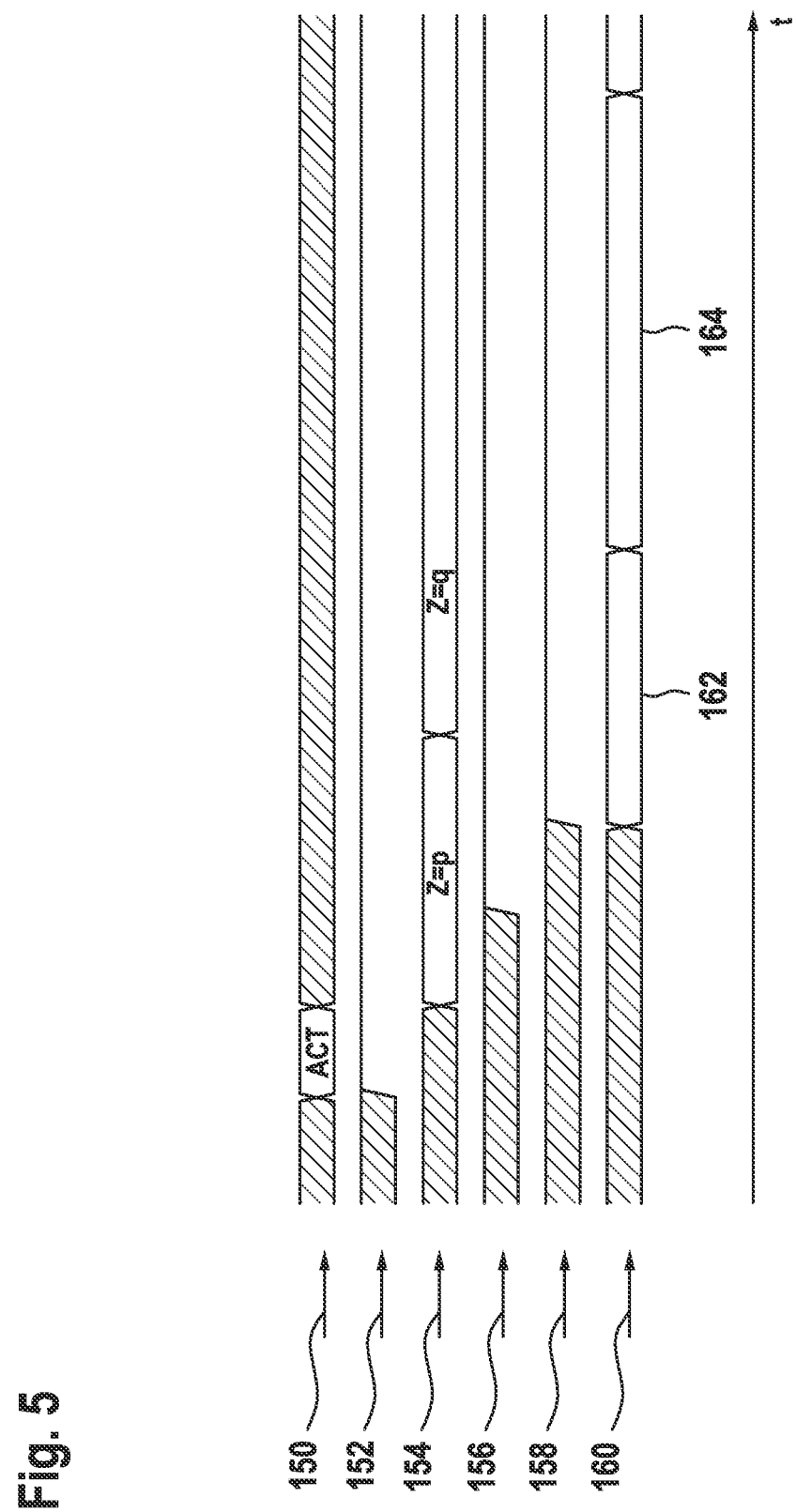

MEMORY DEVICE AND METHOD FOR SHIFTING MEMORY VALUES

FIELD

The present invention relates to a memory device and to a method for shifting memory values, which are stored in memory cells of a row of a cell field of the memory device.

BACKGROUND INFORMATION

In computer applications, such as, e.g., neural networks or applications in the area of machine learning, the execution speed may be limited by the available memory bandwidth. This may be addressed by using special memory devices that have a high memory bandwidth. It is also possible to try to reduce the quantity of data to be transmitted. This may be done for example by data reduction techniques, such as for example the use of so-called sparse matrices. It is also possible to use numerical values having fewer significant digits in calculations, which accordingly have a lower memory requirement.

SUMMARY

The present invention provides a memory device and a method for shifting memory values. Advantageous developments of the present invention are disclosed herein.

The present invention makes it possible to shift memory values of memory cells within the same row. Thus, binary numbers in particular, which are represented by the memory values, may be multiplied by a power of two or divided by a power of two. Calculations may thus be performed directly in the memory without having to burden the memory interface, i.e., the memory bandwidth. It is only necessary to transmit appropriate commands via an instruction bus of the memory. This solves the problem of a limitation by the memory bandwidth, as a result of which lower costs are incurred than when using memory devices having a high bandwidth or when using data reduction methods, and a higher precision and/or a lower load on a processor connected to the memory are achieved.

In accordance with an example embodiment of the present invention, the memory device, in particular DRAM memory device, comprises a cell field having a plurality of memory cells, a number N of bit lines, which are respectively connected to at least one of the memory cells of the cell field, N being a whole number greater than one, and a bit line number in the range from 1 to N being assignable (or being assigned) to each bit line according to a bit line sequence, and a number N of sense amplifiers, a sense amplifier number in the range from 1 to N being assignable (or being assigned) to each sense amplifier according to a sense amplifier sequence. To this extent, the memory device corresponds to conventional memories.

The memory device according to the example embodiment of the present invention comprises a bit shift circuit, which has a number S of switch element rows, S being a whole number greater than one and smaller than or equal to the number N and a row number in the range from zero to S−1 being assignable (or being assigned) to each switch element row according to a switch element row sequence. Each switch element row respectively has at least one semiconductor switch element, each semiconductor switch element being connected to one of the bit lines and one of the sense amplifiers, so that in a conductive state of the semiconductor switch element an electrically conductive connection exists between the bit line and the sense amplifier and that in a non-conductive state of the semiconductor switch element the bit line is insulated from the sense amplifier (i.e. the connection between the bit line and the sense amplifier is disconnected). The semiconductor switch element of each switch element row connect all bit lines, whose bit line number is smaller than or equal to the number N minus the row number of the respective switch element row with sense amplifiers, so that the respective sense amplifier number is equal to the respective bit line number plus the row number of the respective switch element row.

With the aid of the bit shift circuit, the bit lines—and thus the memory cells connected to the bit lines—may be connected to the sense amplifiers in such a way that the numbers of the sequences are shifted relative to one another. The row number, which starts here at zero, indicates by how many numbers or positions the connection between the bit lines and the sense amplifiers is shifted with respect to the original, i.e., the 0th row (number 0), when the semiconductor switch elements of the respective switch elements are in the conductive state. This indicates so to speak, by how many bits the cell contents are shifted when reading out or writing.

The semiconductor switch elements are in particular transistors, e.g. metal-oxide semiconductor field-effect transistors (MOSFET). Using conventional manufacturing technologies, these may be integrated in DRAM (dynamic random access memory) memories that are conventional. The simple design makes it possible to manufacture the semiconductor switch elements or the bit shift circuits in such small dimensions that the line spacing of bit lines of DRAM memories, which may be e.g. below 10 nm, may be maintained. Likewise, no additional layers are required in the chip structure.

In a switch element row of a specific row number, in particular N minus the row number semiconductor switch elements are provided. A switch element number is assignable or is assigned to the semiconductor switch elements of each switch element row, namely, from 1 to N minus the respective row number. On the one hand, each of the semiconductor switch elements is connected to the bit line, whose bit line number is equal to the switch element number of the respective semiconductor switch element. On the other hand, each of the semiconductor switch elements is connected to the sense amplifier, whose sense amplifier number is equal to the sum of the switch element number of the respective semiconductor switch element and the row number of the switch element row, in which the respective semiconductor switch element is located.

For simplification, "primary sense amplifiers" are called "sense amplifiers" in the context of the present application. Thus, unless noted otherwise, "sense amplifier" is always to be understood as a primary sense amplifier. The expressions "connected", "connection" and the like are to be understood within the scope of this application in the sense of electrically conductive connections and are thus synonymous with "electroconductively connected", "electroconductive connection", and the like. Accordingly, "insulated" or "disconnected" is to be understood in the sense that no electrically conductive connection exists.

In accordance with an example embodiment of the present invention, preferably, a row control line is provided for each switch element row, which is connected to gates of the semiconductor switch elements of the respective switch element row. This allows for the joint control of the semiconductor switch elements of each of the switch element rows. Preferably, the number of semiconductor switch elements in each switch element row is equal to the row number of the respective switch element row.

In accordance with an example embodiment of the present invention, the memory device preferably comprises a controller, which is connected to the bit shift circuit, the controller being designed to transfer each switch element row independently of one another into a conductive or non-conductive row state, in the conductive row state of one of the switch element rows, all semiconductor switch elements of the switch element row being switched into the conductive state, and in the non-conductive row state of the switch element row, all semiconductor switch elements of the switch element row being switched into the non-conductive state. The controller is preferably connected to the row control lines or row control line drivers and is designed to produce control voltages at the row control lines that transfer the semiconductor switch elements into the conductive or non-conductive state.

The controller is preferably implemented as hardware, in particular as a state machine. The controller may be provided as a separate circuit in the memory device, but is preferably integrated together with a memory device controller, which controls the memory device, i.e., which performs the data exchange with other devices and controls elements of the memory device. Expediently, all semiconductor switch elements of a switch element row are jointly transferred into the conductive or non-conductive state, so that the same shift is brought about by all semiconductor switch elements of a switch element row.

In accordance with an example embodiment of the present invention, the controller is preferably designed to transfer the bit shift circuit into S different circuit states; in a kth of the S circuit states, the switch element row with row number k being in the conductive row state and the switch element rows, which differ from the switch element row with row number k, being in the non-conductive row state, k being a whole number in the range from 0 to S−1. The controller is preferably further designed to transfer the bit shift circuit into a non-conductive circuit state, in which all switch element rows are in the non-conductive row state. In this manner, defined circuit states of the bit shift circuit are defined or produced, which bring about a shift of the bit line number relative to the sense amplifier number by a specific number k.

In accordance with an example embodiment of the present invention, the memory device preferably comprises word lines, which are respectively connected to multiple memory cells, an application of a word line voltage to a word line enabling access via the bit lines to the memory cells that are connected to the word line. The memory cells furthermore comprise an energy store or charge-coupled memory, such as e.g. a capacitor, and an access transistor, a gate of the respective access transistor being connected to the word line, to which the memory cell is connected, and the access transistor being designed conductively to connect the charge-coupled memory to the bit line, to which the memory cell is connected, when the word line voltage is applied on the word line. This enables the connection of the memory elements (charge-coupled memory), which store the memory value, to the bit lines.

In accordance with an example embodiment of the present invention, preferably, for numbers p and q in the range from 0 to S−1, where q differs from p, the controller is designed to prompt an application of the word line voltage on one of the word lines, to transfer the bit shift circuit into the pth circuit state, subsequently to transfer the bit shift circuit into the qth circuit state, and further preferably to terminate the application of the word line voltage. This implements the shift of the memory contents of a row by p-q positions within a row.

Preferably, for numbers u and/or v in the range from 1 to S−1, the controller is designed to perform a left shift, the controller being designed to prompt an application of the word line voltage on one of the word lines, to transfer the bit shift circuit into the 0th circuit state, subsequently to transfer the bit shift circuit into the uth circuit state, and preferably to terminate the application of the word line voltage; and/or to perform a right shift, the controller being designed to prompt an application of the word line voltage on one of the word lines, to transfer the bit shift circuit into the vth circuit state, subsequently to transfer the bit shift circuit into the 0th circuit state, and preferably to terminate the application of the word line voltage.

This design has the advantage that fewer positions are "lost". "Left"/"right" have no absolute meaning in this context, but merely serve to differentiate the two directions with a row of memory cells. It would also be possible to use "shift in a first direction" (within a row of memory cells) and "shift in a second direction, which is opposite to the first direction". The indication of direction (right/left) coincides with the directions shown in the figures. If a binary number is stored in the memory cells, whose bits are represented by the memory contents of the memory cells, a right shift corresponds to a multiplication by a power of two (2u) and a left shift corresponds to a division by a power of two (2v), or vice versa, depending on in which direction the higher value bits are situated.

In accordance with an example embodiment of the present invention, the controller is preferably designed to receive values for the numbers p and q or u and/or v, and preferably to receive a row address corresponding to the word line. This makes it possible for a shift of bits within the cell field to be performed in a simple manner in that the respective details (numbers, p, q, u, or v, row address) are transmitted to the controller, which is able to store these in corresponding registers. The controller then controls the bit shift circuit in accordance with these details. Additionally, prior to transmitting and receiving these details, a control command (shift command) may be transmitted to the controller via an instruction bus, which may indicate in particular which shift is being performed.

A method according to an example embodiment of the present invention for shifting memory values, which are stored in memory cells of a row to be shifted of a memory device according to the present invention, comprises an application of the word line voltage on a word line, which is connected to the memory cells of the row to be shifted; if a left shift by u positions is to occur, a transfer of the bit shift circuit into the 0th circuit state and subsequently a transfer of the bit shift circuit into the uth circuit state, u being a number in the range from 1 to S−1; or, if a right shift by v positions is to occur, a transfer of the bit shift circuit into the vth circuit state and subsequently a transfer of the bit shift circuit into the 0th circuit state, v being a number in the range from 1 to S−1; and preferably a termination of the application of the word line voltage.

A method according to an example embodiment of the present invention for shifting memory values, which are stored in memory cells of a row to be shifted of a memory device according to the present invention, comprises, if a left shift by u positions is to occur, u being a number in the range from 1 to S−1, a transmission of the number u and of a row address of the row to be shifted to the controller of the memory device and a prompting of the controller to perform the left shift based on the number u and the row address; or, if a right shift by v positions is to occur, v being a number in the range from 1 to S−1, a transmission of the number v and of a row address of the row to be shifted to the controller of the memory device, and a prompting of the controller to perform the right shift based on the number v and the row address.

Additional advantages and developments of the present invention derive from the description and the figures.

The present invention is represented schematically in the figures on the basis of exemplary embodiments and described below with reference to the figures.

BRIEF DESCRIPTION OF THE DRAWINGS

FIGS. 4A and 4B show exemplary shift operations using a bit shift circuit.

FIG. 5 shows the control and state flow of a shift operation using a bit shift circuit.

DETAILED DESCRIPTION OF EXAMPLE EMBODIMENTS

Figure 1:
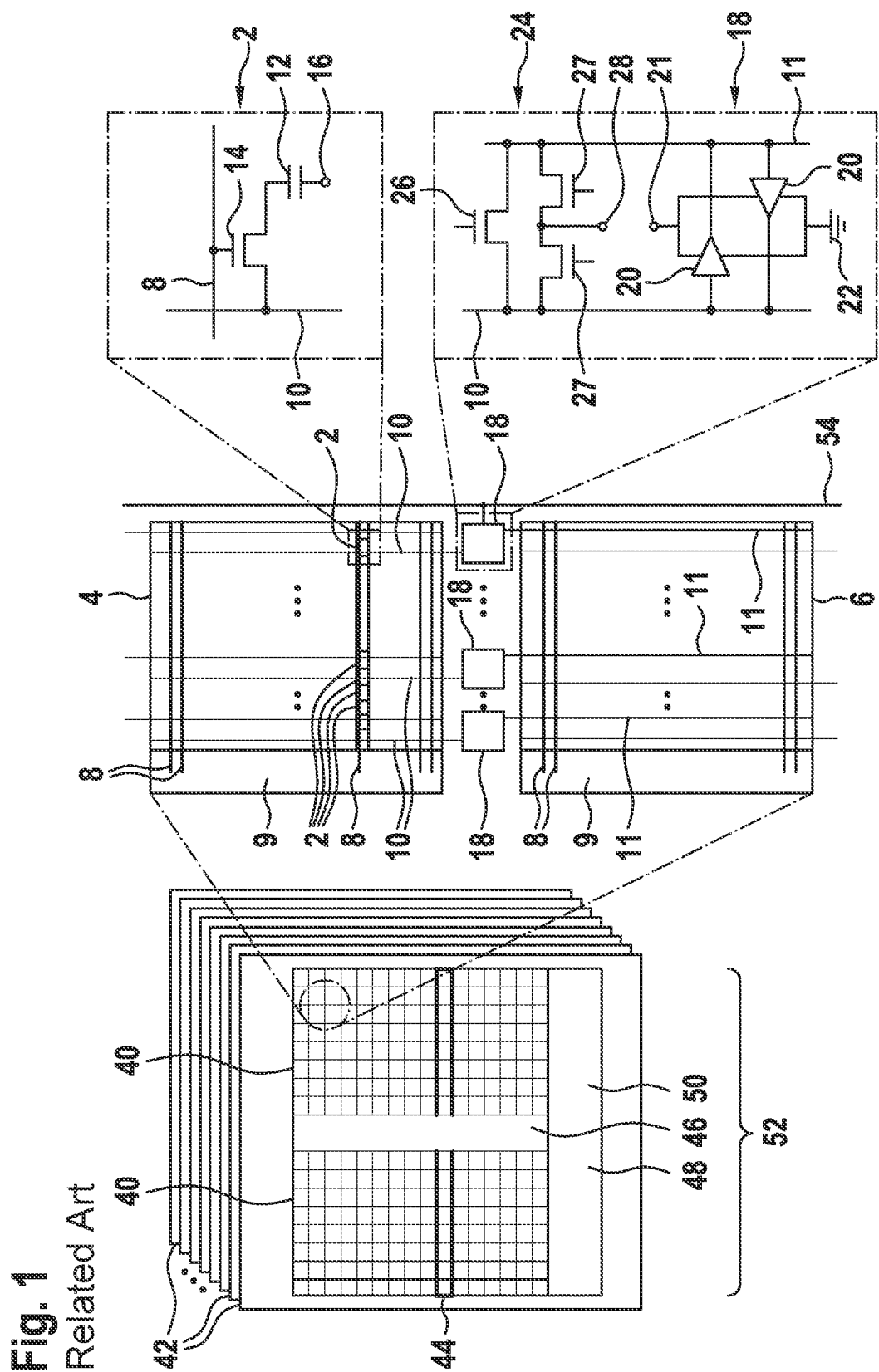
FIG. 1 shows a conventional memory device, in which memory cells are situated in cell fields, it being possible to access the memory cells via bit lines using sense amplifiers.

FIG. 1 shows a conventional memory device, in which memory cells are arranged in arrays, it being possible to access the memory cells via bit lines using primary sense amplifiers. The figure shows the typical hierarchical structure of a portion of a DRAM memory.

The memory cells 2 are arranged in cell fields 4, 6 respectively in rows and columns (only a few representative memory cells are illustrated as small rectangles in the cell fields). In general, a DRAM memory comprises a plurality of such cell fields 4, 6, which are hence also called sub-arrays. Several such sub-arrays are combined into memory arrays 40, which are comprised in so-called memory banks 42. Each memory bank includes row decoders 46 and column decoders 48, master word line drivers and secondary sense amplifiers 50 (not shown in detail). The sub-arrays (cell fields) are arranged in rows and columns, a row of sub-arrays (cell fields 4, 6) being referred to as a memory block 44 or block.

In order to access memory cells 2, an activation command (ACT) is issued to a specific row of memory cells, which activates the associated main word line driver of a memory bank and thus activates local word lines of the sub-arrays (cell fields) via local word line drivers 9. This establishes a charge division relationship between the memory cells and the local bit lines connected to them. Voltage differences arising as a result on the local bit lines are detected by primary sense amplifiers that are integrated with the sub-arrays. In the process, data of a row of memory cells of all sub-arrays in a block are detected simultaneously by the primary sense amplifiers (called a page opening), which may be regarded as a large row buffer or detection of a large page. The page size 52 therefore extends over the entire memory bank (the page size may be e.g. 1 KB). Following the row activation, read commands (RD) or write commands (WR) may be issued to specific columns of this logical row buffer in order to access data via the main data lines 54 (merely one illustrated by way of example) and the secondary sense amplifiers.

The memory cells 2 are electroconductively connected to word lines 8 and bit lines 10, 11 (only some respectively shown in representative fashion), the word lines 8 extending along the rows and the bit lines 10, 11 extending along the columns. The memory cells 2 may be accessed via bit lines 10, i.e., the memory content may be written into memory cells 2 and read out of them via bit lines 10, 11. The bit lines are run out of the cell fields 4, 6 (i.e. the sub-arrays) alternately downward (bit lines 10) and upward (bit lines 11).

A detail on the top right in the figure illustrates in exemplary fashion the structure of a DRAM memory cell 2. A capacitor 12 serves as the memory element, in which a charge corresponding to the memory value may be stored. A transistor 14, called an access transistor, is provided, which makes it possible to switch a connection between the bit line 10 and the capacitor 12 back and forth between a conductive and a non-conductive state. The gate of access transistor 14 is connected to word line 108, the drain terminal is connected to bit line 10 and the source terminal is connected to a terminal or to a side (the upper side in the figure) of capacitor 12, i.e. to a capacitor plate. Due to this simple structure, the memory cells require only very little chip area. The structurally determined size of a memory cell is often specified as a multiple of the square area $F^2$ of the smallest producible structural length F. Such a DRAM memory cell typically requires 6 $F^2$ or 8 $F^2$. The structural length F may be smaller than 10 nm.

If a sufficient word line voltage is applied on word line 8 by way of local word line drivers 9, capacitor 12 is electroconductively connected to bit line 10. The second, lower side (lower terminal) of capacitor 12 is connected to a node 16, which is maintained at a specified voltage $V_{PI}$. For this purpose, node 16 is connected to a voltage source that is common for all memory cells. This voltage is typically equal to half of a supply voltage $V_{DD}$ or bit line voltage $V_{BL}$ ($V_{PI}=V_{BL}/2$). The voltage at the upper side of the capacitor corresponds to the memory state, a voltage of approximately 0 V or of approximately $V_{BL}$ being applied here, corresponding to the two possible values of a bit. Through leakage currents, charge drains off from the capacitor so that the capacitor voltage falls and a so-called refresh must be performed at certain time intervals, in which the memory cells of a row are connected to and then disconnected from sense amplifiers. Memory cells 2, in which the access transistor 14 is in a conductive state, are designated as activated or are in an activated state. Rows, whose memory cells are activated, are also designated as activated or are in an activated state.

Since the capacitance of capacitors 12 of memory cells 2 is very small, in particular small compared to a capacitance of bit lines 10, the connection of the capacitors to the bit lines results only in small voltage differences of the bit lines (approximately in the range of 100 mV). These small voltage differences are amplified using sense amplifiers 18.

FIG. 1 shows primary sense amplifiers 18, with the aid of which the memory content (stored charge) of memory cells may be read out and which at the same time serve to write the memory content into the memory cells. For simplification, "primary sense amplifiers" are called "sense amplifiers". Thus, unless noted otherwise, "sense amplifier" is always to be understood as a primary sense amplifier. Each sense amplifier 18 is connected to two bit lines 10, 11, namely, respectively a bit line from each of the two cell fields 4, 6. If memory cells in the upper cell field 4 are read out via bit lines 10 (by activating a row in the upper cell field), the bit lines 11 of the lower cell field 6, which are connected to the sense amplifiers 18, act as reference bit lines, no row being activated in the lower cell field. Prior to activating the row, bit lines 10, 11 are precharged to a specified voltage (more precisely to half of the bit line voltage $V_{BL}/2$), and the voltage between the two bit lines, which are connected to a sense amplifier, is equalized.

The application of the word line voltage to a word line (activation of the row) results in a small voltage difference between the bit lines, which are connected to the memory cells that are to be accessed, and the reference bit lines. The application of the word line voltage to a word line is also referred to as activating the word line.

A detail shows a typical structure of a sense amplifier 18. It comprises essentially two degenerated inverters 20, which are connected to two bit lines 10, 11. The supply terminals of the inverters are supplied on the one hand with the bit line voltage $V_{BL}$ (node/terminal 21) and on the other hand with a reference voltage (0 V, node/terminal 22). A small voltage difference between the bit lines 10, 11 is amplified by sense amplifier 18, so that the bit line voltage $V_{BL}$ is applied on one bit line, and the reference voltage (0 V) is applied on the other bit line. These voltages may then be read out via the secondary sense amplifiers and amplified further. The inverters may be constructed as CMOS inverters (CMOS: complementary metal-oxide semiconductor) from two transistors (a PMOS, p-channel metal-oxide semiconductor field-effect transistor, and an NMOS, n-channel metal-oxide semiconductor field-effect transistor). Accordingly, a sense amplifier is in the simplest case constructed from four transistors.

In a write process, in principle, a voltage difference is produced at the sense amplifiers 18 (in accordance with the bits to be stored) and thus corresponding voltages or charges are produced at the capacitors 12 of the memory cells 2 of an activated row. By transferring the access transistors 14 then into the non-conductive state (in the process of which e.g. the voltage at the respective word line is brought to 0), the respective charges in capacitors 12 are maintained. Every read process is at the same time also connected to a write process, in which the stored values are renewed (refresh).

Due to the structure, every row, i.e. all memory cells of a row, is always accessed simultaneously. A row is also called a "page". Since both read processes as well as write processes occur by way of the sense amplifiers, the latter are also called "write-read amplifiers".

The detail furthermore shows in simplified fashion an equalization circuit 24, which is used to equalize the voltage between the two bit lines 10, 11 connected to the sense amplifier 18. Equalization circuit 24 may be regarded as part of sense amplifier 18. As shown here, it may be implemented using one or multiple switch elements 26, 27 (in particular semiconductor switch elements or transistors). A terminal 28 may be provided, via which (when connected to an appropriate supply line) the bit lines 10, 11 may be precharged (to half of the bit line voltage $V_{BL}/2$).

A cell field typically has both bit lines that run upward out of the cell field as well as bit lines that run downward out of the cell field (as indicated in the figure). The arrangement of memory cells shown in FIG. 1 in two spatially separated cell fields and their illustrated connection via bit lines with sense amplifiers is usually referred to as an "open bit line architecture". Also conventional is an arrangement, in which the memory cells together with the bit lines, which are connected to a sense amplifier, are arranged in a cell field, the bit lines running in a kind of zig-zag path through the cell field; the two cell fields being laid into each other or folded, as it were. This arrangement is known by the term "folded bit line architecture". The present invention may in principle be implemented in both arrangements or also in other arrangements, the description below being provided with reference to figures that show an "open bit line architecture".

Figure 2:
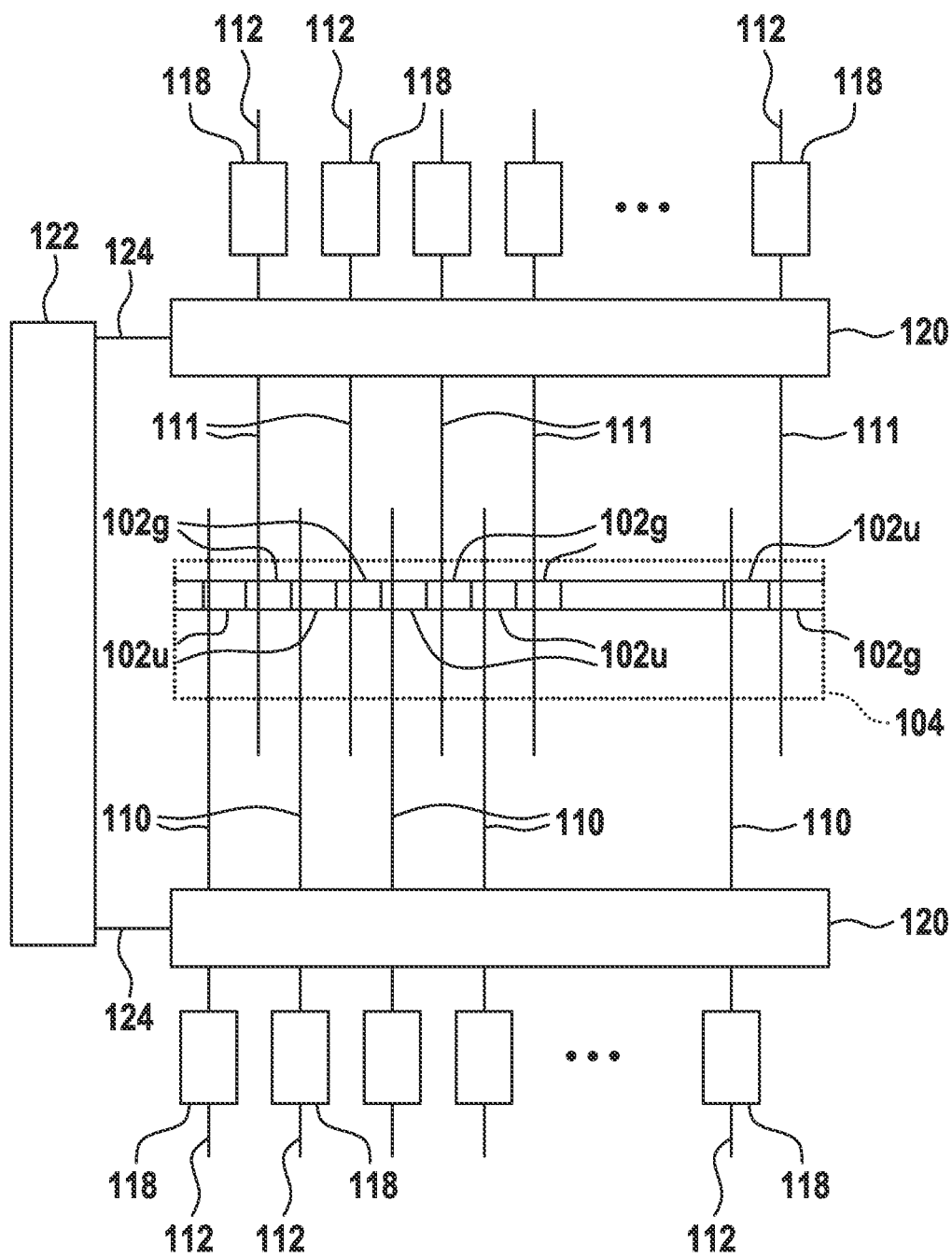
FIG. 2 shows an overview over the bit shift architecture, which may be implemented in accordance with an example embodiment of the present invention in a memory device.

FIG. 2 shows an overview over the bit shift architecture, which may be implemented in accordance with the present invention in a memory device. A cell field 104 is shown having memory cells 102*u*, 102*g*, whose bit lines 110, 111 are connected to bit shift circuits 120, which in turn are connected to sense amplifiers 118. The cell field 104, the memory cells 102 and the sense amplifiers 118 are constructed as described in connection with FIG. 1 and function accordingly. Furthermore, bit lines 112 of neighboring cell fields connected to the sense amplifiers are illustrated, which serve as reference bit lines, i.e., between which and the bit lines of the cell field 104 existing voltage differences in the access to memory cells 102*u*, 102*g* are amplified or generated by the sense amplifiers (cf. the description of FIG. 1).

The bit shift circuits 120 are thus connected between the bit lines or cell field 104 and the sense amplifiers 118. The bit shift circuits 120 in interaction with the sense amplifiers 118 make it possible to shift the bits stored in a row in the memory cells within the row. The shift occurs in such a way that the memory content of memory cells 102*g*, which have an even number according to a numbering of the memory cells along the row, are shifted into other memory cells 102*g* that have an even number. Likewise, memory cells 102*u* having an uneven number are shifted into other memory cells 102*u* that have an uneven number. Preferably, a controller 122, e.g. in the form of a state machine, is provided, which controls the switch elements of the bit shift circuits via row control lines 124. The controller 122 is here illustrated by way of example next to the cell field, but may generally also be situated at a distance from the latter, the controller 122 controlling row control line drivers, which produce the control voltages on the row control lines. The controller is preferably integrated in a memory device controller.

Figure 3:
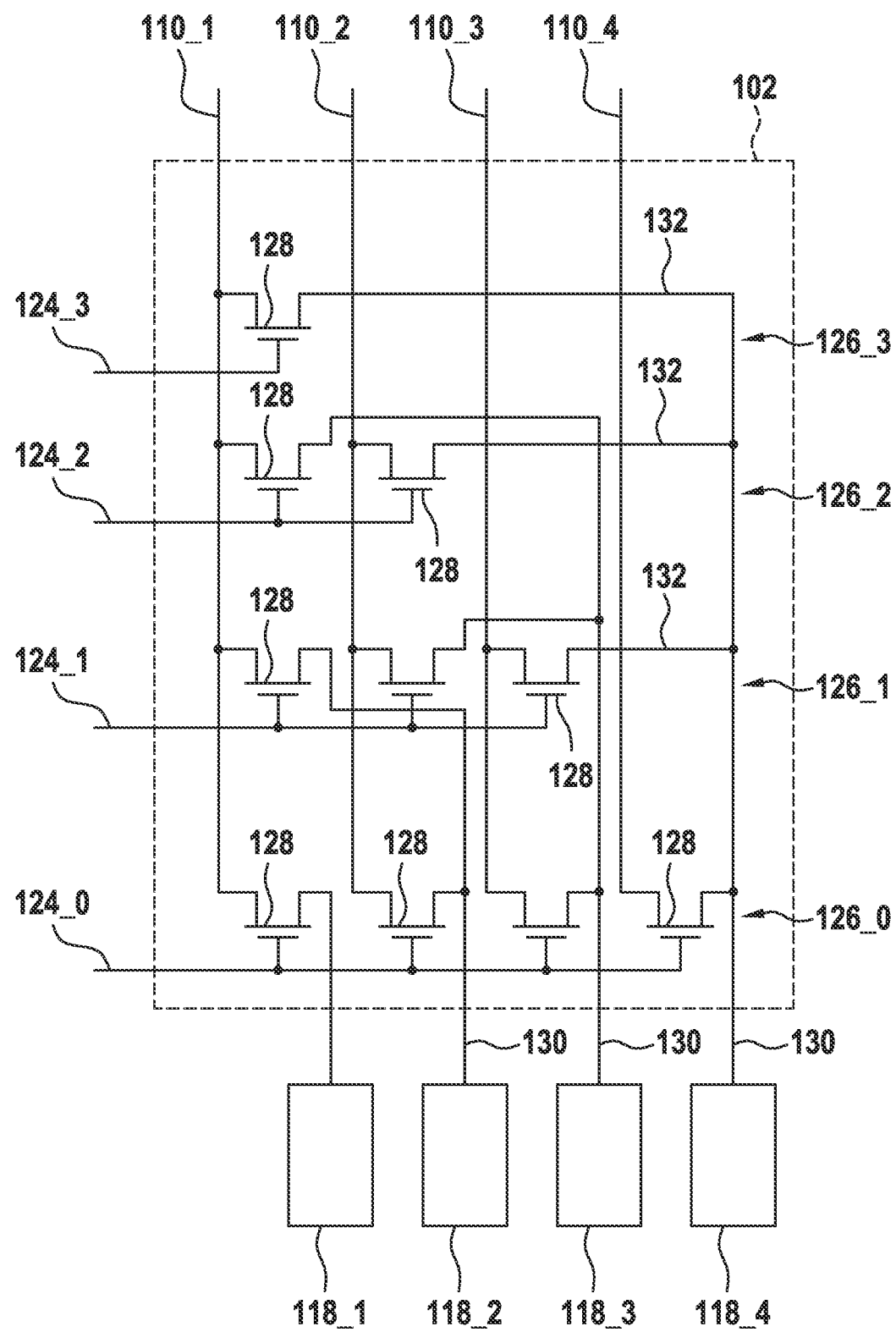
FIG. 3 shows an exemplary bit shift circuit according to the present invention.

FIG. 3 shows an exemplary bit shift circuit 102 according to the present invention. The bit shift circuit 102 is connected on the one hand to bit lines 110_1, 110_2, 110_3, 110_4 and on the other hand to sense amplifiers 118_1, 118_2, 118_3, 118_4 (reference bit lines connected to the sense amplifiers are not shown here). Bit shift circuit 102 comprises multiple rows, designated as switch element rows 126_0, 126_1, 126_2, 126_3, each of which having at least one semiconductor switch element 128. The number after the underline in the reference number indicates here respectively the bit line number, the sense amplifier number or the row number. Each semiconductor switch element 128 is connected to a bit line and to a sense amplifier, so that the semiconductor switch element is able to establish a conductive connection between the bit line and the sense amplifier and to disconnect the connection, depending on whether the semiconductor switch element is in the conductive state or in the non-conductive state. Transistors, in particular field-effect transistors, preferably metal-oxide semiconductor field-effect transistors, are provided as semiconductor switch elements. The connection between bit line and sense amplifier occurs via the drain-source path, which may be switched between a conductive and a non-conductive state as a function of a control voltage applied on a gate. The control voltages are supplied via row control lines 126_0, 126_1, 126_2, 126_3, e.g. by controller 122 or by drivers controlled by the controller.

The illustrated structure makes it possible to satisfy boundary conditions, which are due to the chip structure of a DRAM chip, for example the specified number of layers. In particular, the bit lines and the lines 130 connected to the sense amplifiers (vertical lines in the figure) are situated in a metal layer, the connection lines 132 from the semiconductor switch element to the lines connected to the sense amplifiers are situated in a second metal layer, and the row control lines 126_0, 126_1, 126_2, 126_3 are situated in a polysilicon layer.

In FIG. 3, by way of example, the number of switch element rows equals the number of bit lines or sense amplifiers, that is, equal to four. Generally, the number of bit lines or sense amplifiers may also be unequal to four and/or the number of switch element rows may also be unequal to four, it being necessary that the number of switch element rows is smaller than or equal to the number of bit lines or sense amplifiers. For example, it would be possible that only three switch element rows exist, in which case the switch element row 124_3 in FIG. 3 with row number 3 would not exist.

A bit line number BLN in the range from 1 to N is assigned to each bit line according to a bit line sequence, N designating the number of bit lines and likewise the number of sense amplifiers (which exist in equal number). Likewise, a sense amplifier number LVN in the range from 1 to N is assigned to each sense amplifier according to a sense amplifier sequence. Furthermore, a row number RN in the range from 0 to S−1 is assigned to each switch element row according to a switch element row sequence, S designating the number of the switch element rows, where $1 < S \leq N$.

The semiconductor switch elements connect bit lines an sense amplifiers in such a way that the condition BLN+RN=LVN is fulfilled, RN being the row number of the switch element row, in which the respective semiconductor switch element is situated. The row number thus indicates by how many positions a connection established by a respective semiconductor switch element is shifted with respect to the numberings of the bit lines and of the sense amplifiers.

FIGS. 4A and 4B show exemplary shift operations using a bit shift circuit, which interacts with sense amplifiers, FIG. 4A showing a shift to the right by 1 bit and FIG. 4B showing a shift to the left by 2 bits. When the stored bits represent a binary number, this corresponds—depending on the direction (left/right) in which the higher value bits are stored—to a multiplication or division by a respective power of two. The illustrated elements (bit shift circuit, sense amplifier) were already explained in FIG. 3, so that here reference symbols are largely omitted.

An identical initial state (bits stored accordingly) of the memory cells is assumed in both figures. Here, only four bits are shown, which are stored in memory cells that are connected to the same word line. The initial value 140 is respectively the bit sequence '0101'.

In FIG. 4A, initially the switch element row 126_1 with row number 1 is activated, i.e. the semiconductor switch elements of this switch element row are switched into the conductive state by applying the control voltage to the respective row control line 124_1. The other switch element rows are deactivated, i.e. their semiconductor switch elements are in the non-conductive state. This state of the bit shift circuit is called the 1st circuit state. More generally, a state of the bit shift circuit, in which the semiconductor switch elements of a switch element row with the row number k are in the conductive state and the semiconductor switch elements of the other switch element rows are in the non-conductive state, is called the kth circuit state.

Subsequently, the memory contents of the memory cells are detected by the sense amplifiers 118_1, 118_2, 118_3, 118_4 (by activating the respective row of the cell field, in that the word line voltage is applied on the respective word line; see the description of FIG. 1). This state (1st circuit state, detected memory contents) is shown in the left partial figure of FIG. 4A. The detected values are entered in the figure into the symbols of the sense amplifiers. As may be seen, the values are shifted by one position to the right with respect to the positions of the initial value 140.

Subsequently, the bit shift circuit is transferred into the 0th circuit state (that is, the semiconductor switch elements of the switch element row 126_0 with row number 0 are now controlled, a corresponding control voltage being applied on row control line 124_0, while the semiconductor switch elements of the other switch element rows are blocking).

The values contained in the sense amplifiers are transferred into the memory cells, i.e., corresponding voltages or charges are produced/introduced by the sense amplifiers at the/in the memory cells (see description of FIG. 1). The final value 140A results in the memory cells, namely, '0010', whose positions are shifted to the right by one position with respect to the initial value 140. This state is shown in the right partial figure of FIG. 4A.

Finally, the row of memory cells or the word line is again deactivated and the bit shift circuit is transferred into a non-conductive circuit state (not shown further).

In FIG. 4B, the bit shift circuit is first transferred into the 0th circuit state, i.e., the switch element row 126_0 with row number 0 is activated using a control voltage on the respective row control line 124_0.

Subsequently, the memory contents of the memory cells are detected by the sense amplifiers 118_1, 118_2, 118_3, 118_4 (by activating the respective row of the cell field, in that the word line voltage is applied to the respective word line). This state (0th circuit state, detected memory contents) is shown in the left partial figure of FIG. 4B. The detected values are entered in the figure into the symbols of the sense amplifiers. As may be seen, the values in the sense amplifiers are not shifted with respect to the positions of the initial value 140.

Subsequently, the bit shift circuit is transferred into the 2nd circuit state (that is, the semiconductor switch elements of the switch element row 126_2 with row number 2 are now controlled, a corresponding control voltage being applied on row control line 124_2, while the semiconductor switch elements of the other switch element rows are blocking).

The values contained in the sense amplifiers are transferred into the memory cells. The final value 140B results in the memory cells, namely, '0100', whose positions are shifted to the left by two positions with respect to the initial value 140. This state is shown in the right partial figure of FIG. 4B.

Finally, the row of memory cells or the word line is again deactivated and the bit shift circuit is transferred into a non-conductive circuit state (not shown further).

In comparison to the right partial figures, it can be seen that in the right shift (FIG. 4A) the states of the sense amplifiers agree with the memory states in the memory cells with respect to the numbers of the bit lines and of the sense amplifiers. By contrast, these do not agree in the case of the left shift (FIG. 4B). This must be considered if the shifted memory values are to be transferred to secondary sense amplifiers.

In the left shift and right shift, memory cells at the right or left edge of the row of memory cells may be filled with a specific value (i.e. bit 0 or 1, here 0). For this purpose, additional semiconductor switch elements may be provided (not shown), which allow for a connection of these bit lines to respective voltages (0 V or $V_{BL}$).

FIG. 5 shows generally the control and state flow of a shift operation using a bit shift circuit. Instructions or corresponding control voltages and states assumed by components of the memory device are plotted against time t.

A command signal is shown in a row 150, only an activation instruction or activation command ACT for a word line being given here. In line 156, the associated activation of the word line by application of a word line voltage is shown.

In line 152, a calculation signal is shown, which indicates the start of a calculation, i.e. of a shift of bits. Line 154 shows signals, which correspond to or prompt the transfer of the bit shift circuit into specific circuit states Z=p or Z=q. In the course of time, the bit shift circuit first assumes the pth circuit state and subsequently the qth circuit state, where q should be unequal to p. This succession of different circuit states brings about the shift of bits, as explained in connection with FIGS. 4A, 4B. The sequence of FIG. 4A corresponds to p=1 and q=0. The sequence of FIG. 4B corresponds to p=0 and q=2. Depending on whether p is greater than or smaller than q, a shift occurs to the right or to the left.

Line 158 furthermore shows a sense amplifier activation signal. Row 160 shows the sense amplifier state, in particular a state 162 being shown, in which the content of the memory cells is detected by the sense amplifiers, and a state 164, in which the content of the sense amplifiers is written back into the memory cells.

What is claimed is:

1. A memory device, comprising:
   a cell field having a plurality of memory cells;
   a number N of bit lines, which are each respectively connected to at least one of the memory cells of the cell field, N being a whole number greater than one and a bit line number in a range from 1 to N being assignable to each bit line according to a bit line sequence;
   N sense amplifiers, a sense amplifier number in the range from 1 to N being assignable to each sense amplifier according to a sense amplifier sequence; and
   a bit shift circuit, which has a number S of switch element rows, S being a whole number greater than one and a row number in a range from zero to S-1 being assignable to each switch element row according to a switch element row sequence;
   wherein each switch element row has respectively at least one semiconductor switch element, each semiconductor switch element being connected to one of the bit lines and to one of the sense amplifiers, so that in a conductive state of the semiconductor switch element an electrically conductive connection exists between the bit line and the sense amplifier and in a non-conductive state of the semiconductor switch element the bit line is insulated from the sense amplifier;
   wherein the semiconductor switch elements of each respective switch element row connects all bit lines whose bit line number is smaller than or equal to the number N minus the row number of the respective switch element row, to sense amplifiers, so that the respective sense amplifier number is equal to the respective bit line number plus the row number of the respective switch element row.

2. The memory device as recited in claim 1, wherein for each switch element row, a row control line is provided which is connected to gates of the semiconductor switch elements of the respective switch element row.

3. The memory device as recited in claim 1, further comprising:
   a controller which is connected to the bit shift circuit, the controller being configured to transfer each switch element row independently of one another into a conductive or non-conductive row state;
   wherein in the conductive row state of each switch element row of the switch element rows, all semiconductor switch elements of the switch element row being switched into the conductive state, and in the non-conductive row state of the switch element row, all semiconductor switch elements of the switch element row being switched into the non-conductive state.

4. The memory device as recited in claim 3, wherein for each switch element row, a row control line is provided which is connected to gates of the semiconductor switch elements of the respective switch element row, and wherein the controller is connected to the row control lines or row control line drivers and is configured to produce control voltages at the row control lines that transfer the semiconductor switch elements into the conductive or non-conductive state.

5. The memory device as recited in claim 4, further comprising:
   word lines which are each respectively connected to multiple memory cells, an application of a word line voltage to a word line enabling access via the bit lines to the memory cells that are connected to the word line;
   wherein for numbers p and q in the range from 0 to S-1, where q differs from p, the controller is configured to:
   prompt an application of the word line voltage on one of the word lines,
   transfer the bit shift circuit into the pth circuit state,
   subsequent to transferring the bit shift circuit to the pth circuit state, transfer the bit shift circuit into the qth circuit state, and
   terminate the application of the word line voltage.

6. The memory device as recited in claim 5, wherein for numbers u and/or v in the range from 1 to S-1, the controller is configured to:
   perform a left shift, the controller being configured to prompt an application of the word line voltage on one of the word lines, to transfer the bit shift circuit into the 0th circuit state, subsequently to transfer the bit shift circuit into the uth circuit state, and terminate the application of the word line voltage; and/or
   perform a right shift, the controller being configured to prompt an application of the word line voltage on one of the word lines, to transfer the bit shift circuit into the with circuit state, subsequently to transfer the bit shift circuit into the 0th circuit state, and terminate the application of the word line voltage.

7. The memory device as recited in claim 6, wherein the controller is to receive values for the numbers (i) p and q or (ii) u and/or v, and the controller being configured to receive a row address corresponding to the word line.

8. The memory device as recited in claim 3, wherein the controller is configured to transfer the bit shift circuit into S different circuit states, wherein in a kth of the S circuit states, the switch element row with row number k being in the conductive row state and the switch element rows, which differ from the switch element row with row number k, being in the non-conductive row state, k being a whole number in the range from 0 to S−1, and wherein the controller is configured to transfer the bit shift circuit into a non-conductive circuit state, in which all switch element rows are in the non-conductive row state.

9. The memory device as recited in claim 1, further comprising:
word lines which are each respectively connected to multiple memory cells, an application of a word line voltage to a word line enabling access via the bit lines to the memory cells that are connected to the word line.

10. The memory device as recited in claim 9, wherein the memory cells each include a respective charge-coupled memory and a respective access transistor, a gate of the respective access transistor being connected to the word line to which the memory cell is connected, and the respective access transistor being configured conductively to connect the respective charge-coupled memory to the bit line to which the memory cell is connected, when the word line voltage is applied on the word line.

11. A method for shifting memory values, which are stored in memory cells of a first row of a memory device to be shifted, the memory device including:
a cell field having a plurality of memory cells,
a number N of bit lines, which are each respectively connected to at least one of the memory cells of the cell field, N being a whole number greater than one and a bit line number in a range from 1 to N being assignable to each bit line according to a bit line sequence,
N sense amplifiers, a sense amplifier number in the range from 1 to N being assignable to each sense amplifier according to a sense amplifier sequence, and
a bit shift circuit, which has a number S of switch element rows, S being a whole number greater than one and a row number in a range from zero to S−1 being assignable to each switch element row according to a switch element row sequence,
wherein each switch element row has respectively at least one semiconductor switch element, each semiconductor switch element being connected to one of the bit lines and to one of the sense amplifiers, so that in a conductive state of the semiconductor switch element an electrically conductive connection exists between the bit line and the sense amplifier and in a non-conductive state of the semiconductor switch element the bit line is insulated from the sense amplifier,
wherein the semiconductor switch elements of each respective switch element row connects all bit lines whose bit line number is smaller than or equal to the number N minus the row number of the respective switch element row, to sense amplifiers, so that the respective sense amplifier number is equal to the respective bit line number plus the row number of the respective switch element row,
wherein the memory device further includes a controller which is connected to the bit shift circuit, the controller being configured to transfer each switch element row independently of one another into a conductive or non-conductive row state,
wherein in the conductive row state of each switch element row of the switch element rows, all semiconductor switch elements of the switch element row being switched into the conductive state, and in the non-conductive row state of the switch element row, all semiconductor switch elements of the switch element row being switched into the non-conductive state,
wherein the controller is configured to transfer the bit shift circuit into S different circuit states, wherein in a kth of the S circuit states, the switch element row with row number k being in the conductive row state and the switch element rows, which differ from the switch element row with row number k, being in the non-conductive row state, k being a whole number in the range from 0 to S−1, and wherein the controller is configured to transfer the bit shift circuit into a non-conductive circuit state, in which all switch element rows are in the non-conductive row state,
wherein the memory device further includes word lines which are each respectively connected to multiple memory cells, an application of a word line voltage to a word line enabling access via the bit lines to the memory cells that are connected to the word line,
wherein the method comprises the following steps:
applying the word line voltage on a word line which is connected to the memory cells of the first row to be shifted;
(i) when a left shift by u positions is to occur, transferring the bit shift circuit into the 0th circuit state and subsequently transferring the bit shift circuit into a uth circuit state, u being a number in the range from 1 to S−1, and (ii) when a right shift by v positions is to occur, transferring the bit shift circuit into a with circuit state and subsequently transferring the bit shift circuit into the 0th circuit state, v being a number in the range from 1 to S−1; and
terminating the application of the word line voltage.

12. A method for shifting memory values, which are stored in memory cells of a first row of a memory device to be shifted the memory device including:
a cell field having a plurality of memory cells,
a number N of bit lines, which are each respectively connected to at least one of the memory cells of the cell field, N being a whole number greater than one and a bit line number in a range from 1 to N being assignable to each bit line according to a bit line sequence,
N sense amplifiers, a sense amplifier number in the range from 1 to N being assignable to each sense amplifier according to a sense amplifier sequence, and
a bit shift circuit, which has a number S of switch element rows, S being a whole number greater than one and a row number in a range from zero to S−1 being assignable to each switch element row according to a switch element row sequence;
wherein each switch element row has respectively at least one semiconductor switch element, each semiconductor switch element being connected to one of the bit lines and to one of the sense amplifiers, so that in a conductive state of the semiconductor switch element an electrically conductive connection exists between the bit line and the sense amplifier and in a non-conductive state of the semiconductor switch element the bit line is insulated from the sense amplifier;
wherein the semiconductor switch elements of each respective switch element row connects all bit lines whose bit line number is smaller than or equal to the number N minus the row number of the respective switch element row, to sense amplifiers, so that the respective sense amplifier number is equal to the respective bit line number plus the row number of the respective switch element row
wherein the memory device further includes a controller which is connected to the bit shift circuit, the controller being configured to transfer each switch element row independently of one another into a conductive or non-conductive row state, wherein in the conductive row state of each switch element row of the switch element rows, all semiconductor switch elements of the switch element row being switched into the conductive state, and in the non-conductive row state of the switch element row, all semiconductor switch elements of the switch element row being switched into the non-conductive state, wherein for each switch element row, a row control line is provided which is connected to gates of the semiconductor switch elements of the respective switch element row, and wherein the controller is connected to the row control lines or row control line drivers and is configured to produce control voltages at the row control lines that transfer the semiconductor switch elements into the conductive or non-conductive state, wherein the memory device further includes word lines which are each respectively connected to multiple memory cells, an application of a word line voltage to a word line enabling access via the bit lines to the memory cells that are connected to the word line, wherein for numbers p and q in the range from 0 to S−1, where q differs from p, the controller is configured to:
prompt an application of the word line voltage on one of the word lines,
transfer the bit shift circuit into the pth circuit state,
subsequent to transferring the bit shift circuit to the pth circuit state, transfer the bit shift circuit into the qth circuit state, and
terminate the application of the word line voltage wherein for numbers u and/or v in the range from 1 to S−1, the controller is configured to:
(i) perform a left shift, the controller being configured to prompt an application of the word line voltage on one of the word lines, to transfer the bit shift circuit into the 0th circuit state, subsequently to transfer the bit shift circuit into the uth circuit state, and terminate the application of the word line voltage, and/or (ii) perform a right shift, the controller being configured to prompt an application of the word line voltage on one of the word lines, to transfer the bit shift circuit into the with circuit state, subsequently to transfer the bit shift circuit into the 0th circuit state, and terminate the application of the word line voltage, wherein the controller is to receive values for the numbers (i) p and q or (ii) u and/or v, and the controller being configured to receive a row address corresponding to the word line, wherein the method comprises the following steps:
(i) when a left shift by u positions is to occur, u being a number in the range from 1 to S−1: transferring the number u and a row address of the row to be shifted to the controller of the memory device, and prompting the controller to perform the left shift based on the number u and the row address, and (ii) when a right shift by v positions is to occur, v being a number in the range from 1 to S−1: transferring the number v and a row address of the row to be shifted to the controller of the memory device, and prompting the controller to perform the right shift based on the number v and the row address.

* * * * *